(12) United States Patent
Miyahara et al.

(10) Patent No.: US 9,874,706 B2
(45) Date of Patent: Jan. 23, 2018

(54) OPTICAL TRANSMISSION MODULE AND METHOD FOR MANUFACTURING OPTICAL TRANSMISSION MODULE

(71) Applicant: OLYMPUS CORPORATION, Tokyo (JP)

(72) Inventors: Hideharu Miyahara, Nagano (JP); Hiroyuki Motohara, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/260,927

(22) Filed: Sep. 9, 2016

(65) Prior Publication Data
US 2016/0377820 A1    Dec. 29, 2016

Related U.S. Application Data

(63) Continuation of application No. PCT/JP2015/057193, filed on Mar. 11, 2015.

(30) Foreign Application Priority Data

Mar. 13, 2014  (JP) .................................. 2014-050574

(51) Int. Cl.
*G02B 6/36* (2006.01)
*G02B 6/42* (2006.01)
(Continued)

(52) U.S. Cl.
CPC ............... *G02B 6/424* (2013.01); *G02B 6/32* (2013.01); *G02B 6/3608* (2013.01);
(Continued)

(58) Field of Classification Search
USPC ......................................................... 385/78
See application file for complete search history.

(56) References Cited

U.S. PATENT DOCUMENTS

| 2011/0170833 A1* | 7/2011 | Moidu | ................. | G02B 6/4248 |
| | | | | 385/94 |
| 2014/0270650 A1* | 9/2014 | Kasten | ................... | G02B 6/423 |
| | | | | 385/78 |

(Continued)

FOREIGN PATENT DOCUMENTS

| CN | 101999089 A | 3/2011 |
| JP | 2007-019348 A | 1/2007 |

(Continued)

OTHER PUBLICATIONS

International Search Report dated Jun. 2, 2015 issued in PCT/JP2015/057193.

*Primary Examiner* — Eric Wong
(74) *Attorney, Agent, or Firm* — Scully, Scott, Murphy & Presser, P.C.

(57) ABSTRACT

An optical transmission module includes an optical element including a light-emitting section configured to output light of an optical signal, a hollow cylindrical body joined perpendicularly to a light output surface of the optical element, a wiring board, on a first principal surface of which the optical element is mounted and through a hole of which the hollow cylindrical body is inserted, and an optical fiber configured to transmit the optical signal, a distal end portion of which is inserted into the hollow cylindrical body.

10 Claims, 7 Drawing Sheets

(51) Int. Cl.
 G02B 6/32 (2006.01)
 H01S 5/022 (2006.01)
(52) U.S. Cl.
 CPC ......... G02B 6/4202 (2013.01); G02B 6/4238 (2013.01); H01S 5/02284 (2013.01)

(56) References Cited

U.S. PATENT DOCUMENTS

2014/0321817 A1* 10/2014 Wang ................... G02B 6/4231
 385/89
2016/0124153 A1* 5/2016 Cabessa ............... G02B 6/3885
 156/60

FOREIGN PATENT DOCUMENTS

| JP | 2010-135513 A | 6/2010 |
| JP | 2013-025092 A | 2/2013 |

* cited by examiner

OPTICAL TRANSMISSION MODULE AND METHOD FOR MANUFACTURING OPTICAL TRANSMISSION MODULE

CROSS REFERENCE TO RELATED APPLICATION

This application is a continuation application of PCT/JP2015/057193 filed on Mar. 11, 2015 and claims benefit of Japanese Application No. 2014-050574 filed in Japan on Mar. 13, 2014, the entire contents of which are incorporated herein by this reference.

BACKGROUND OF THE INVENTION

1. Field of the Invention

The present invention relates to an optical transmission module provided with an optical element and an optical fiber that transmits light of an optical signal outputted from a light-emitting section of the optical element, and a method for manufacturing the optical transmission module.

2. Description of the Related Art

It is important for optical transmission modules provided with an optical element and an optical fiber that transmits light of an optical signal outputted from a light-emitting section of the optical element to perform accurate positioning of the light-emitting section and the optical fiber.

For example, Japanese Patent Application Laid-Open Publication No. 2013-025092 discloses an optical transmission module provided with an optical element, a substrate on which the optical element is mounted, an optical fiber holding member (ferrule) including a through hole for inserting an optical fiber that transmits an optical signal outputted from the optical element. Positioning of the light-emitting section of the optical element and the optical fiber is performed by inserting the optical fiber into the through hole of the optical fiber holding member.

SUMMARY OF THE INVENTION

An optical transmission module according to an embodiment of the present invention is provided with an optical element including a light-emitting section configured to output light of an optical signal; a hollow cylindrical body joined perpendicularly to a light output surface of the optical element; a wiring board configured to have a hole that penetrates a first principal surface and a second principal surface, in which the optical element is mounted on the first principal surface and the hollow cylindrical body is inserted through the hole; and an optical fiber configured to transmit the optical signal, a distal end portion of which is inserted into the hollow cylindrical body, and an outside diameter of which is equal to an inside diameter of the hollow cylindrical body.

A method for manufacturing an optical transmission module according to another embodiment is provided with a hollow cylindrical body joining step of joining a hollow cylindrical body perpendicularly to a light output surface which outputs light of an optical signal of an optical element; a mounting step of inserting the hollow cylindrical body through a hole of a wiring board, the hole penetrating a first principal surface and a second principal surface, and mounting the optical element on the first principal surface; and an optical fiber inserting step of inserting a distal end portion of an optical fiber configured to transmit the optical signal into the hollow cylindrical body, an outside diameter of the optical fiber being equal to an inside diameter of the hollow cylindrical body.

DETAILED DESCRIPTION OF THE PREFERRED EMBODIMENT

First Embodiment

Figure 1:
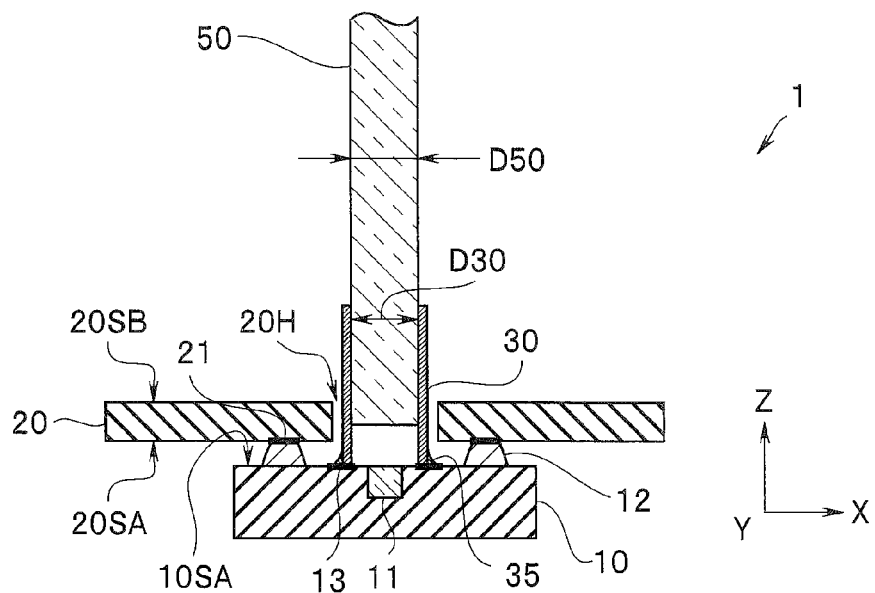
FIG. 1 is a cross-sectional view of an optical transmission module according to a first embodiment.
Figure 2:
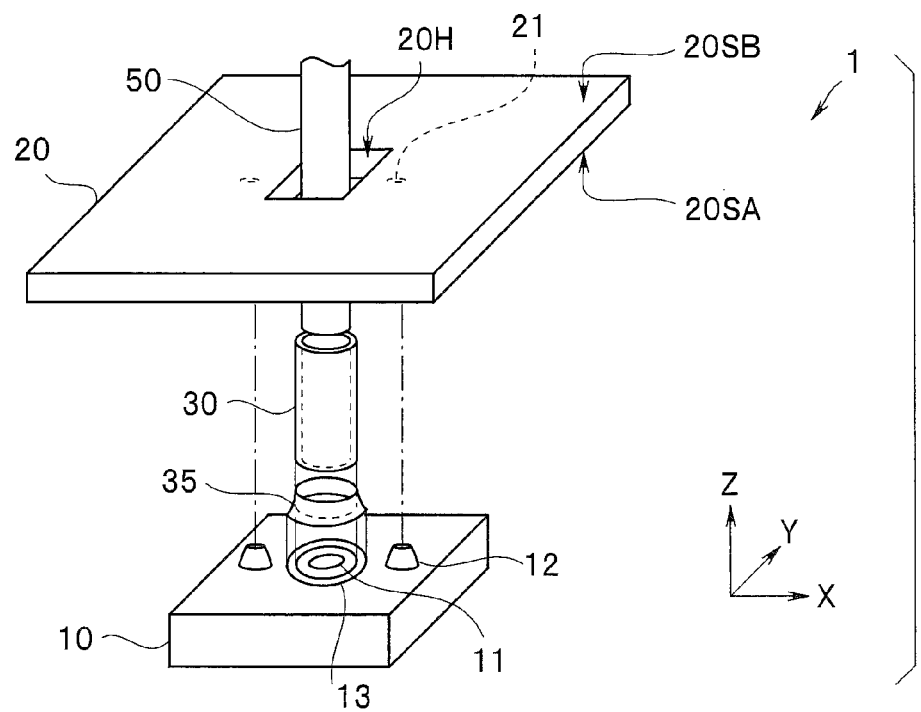
FIG. 2 is an exploded view of the optical transmission module according to the first embodiment.

An optical transmission module 1 of a first embodiment will be described using FIG. 1 and FIG. 2. The optical transmission module 1 according to the present embodiment is a so-called E/O module that converts an electric signal to an optical signal and transmits the optical signal.

The optical transmission module 1 includes an optical element 10, a wiring board 20, a hollow cylindrical body 30 and an optical fiber 50. The optical element 10 is a light-emitting device including a light-emitting section 11 configured to output light of an optical signal. The hollow cylindrical body 30 is joined perpendicularly to a light output surface 10SA of the optical element 10. The wiring board 20 includes a hole 20H that penetrates a first principal surface 20SA and a second principal surface 20SB, the optical element 10 is mounted on the first principal surface 20SA and the hollow cylindrical body 30 is inserted through the hole 20H. A distal end portion of the optical fiber 50 that transmits the optical signal is inserted into the hollow cylindrical body 30 and an outside diameter D50 of the optical fiber 50 is the same as an inside diameter D30 of the hollow cylindrical body 30.

The optical element 10 is a rectangular parallelepiped surface emitting laser chip whose light output surface 10SA has dimensions of, for example, 250 μm×300 μm and includes the light-emitting section 11 having a diameter of 20 μm and an electrode 12 that supplies a drive signal to the light-emitting section 11 on the light output surface 10SA. Furthermore, a doughnut-shaped metal film 13 for solder-bonding the hollow cylindrical body 30 is disposed around the light-emitting section 11. The metal film 13 which is formed at the same time as when the electrode 12 is formed is a multilayer film made of, for example, Ti/Ni/Cu.

The distal end portion of the optical fiber 50 is inserted into the hollow cylindrical body 30 which is joined perpendicularly to the light output surface 10SA of the optical element 10, stands upright and is an important component of the present embodiment. The hollow cylindrical body 30 is joined to the metal film 13 of the optical element 10 via solder 35. A joint position of the hollow cylindrical body 30 is uniquely determined by a position of the metal film 13. The metal film 13 is disposed in such a way that its relative position with respect to the light-emitting section 11 is accurately determined by, for example, a photolithography process. The optical fiber 50 inserted into the hollow cylindrical body 30 whose relative position with respect to the light-emitting section 11 is accurately determined is disposed in such a way that its relative position with respect to the light-emitting section 11 is accurately determined.

Note that the optical fiber 50 can be inserted into the hollow cylindrical body 30 if the inside diameter D30 of the hollow cylindrical body 30 is equal to or greater than the outside diameter D50 of the optical fiber 50 (D30≥D50). However, when the inside diameter D30 of the hollow cylindrical body 30 is significantly greater than the outside diameter D50 of the optical fiber 50 (D30>>D50), the positioning accuracy of the optical fiber 50 deteriorates. For this reason, the inside diameter D30 of the hollow cylindrical body 30 is preferably substantially equal to the outside diameter D50 of the optical fiber 50, for example, (D50+10 µm)≥D30≥D50 and particularly preferably (D50+2 µm)≥D30≥D50.

Note that the hollow cylindrical body 30 is only required to have an outside diameter greater than the inside diameter D30 by 1 µm or more and by 20 µm or less and have a length equal to or greater than 1 mm and equal to or less than 10 mm, and the hollow cylindrical body 30 in which the optical fiber 50 is inserted is only required to be able to remain in an upright position with respect to the light output surface 10SA of the optical element 10.

The wiring board 20 includes a connection electrode 21 or the like joined to the electrode 12 of the optical element 10 on the first principal surface 20SA. The optical element 10 is flip-chip-mounted on the wiring board 20 with the hollow cylindrical body 30 inserted through the hole 20H. The size and shape of the hole 20H are not particularly limited as long as the hollow cylindrical body 30 can be inserted through the hole.

Since the distal end portion of the optical fiber 50 is inserted in the hollow cylindrical body 30 accurately joined at a predetermined position of the optical element 10, the optical transmission module 1 provides a high level of accuracy in positioning of the light-emitting section 11 of the optical element 10 and the optical fiber 50. Note that the hollow cylindrical body 30 having the predetermined inside diameter D30 with high dimensional accuracy is easily available.

Moreover, since no relatively large optical fiber holding member is included, the size of the optical transmission module 1 is small.

Furthermore, in the optical transmission module 1, the hollow cylindrical body 30 made of a metal having high thermal conductivity is joined to the metal film 13 of the optical element 10 with the solder 35. Since heat generated in the optical element 10 is efficiently transmitted via the hollow cylindrical body 30, the optical transmission module 1 operates stably and exhibits high reliability.

<Method for Manufacturing Optical Transmission Module 1>

Figure 3:
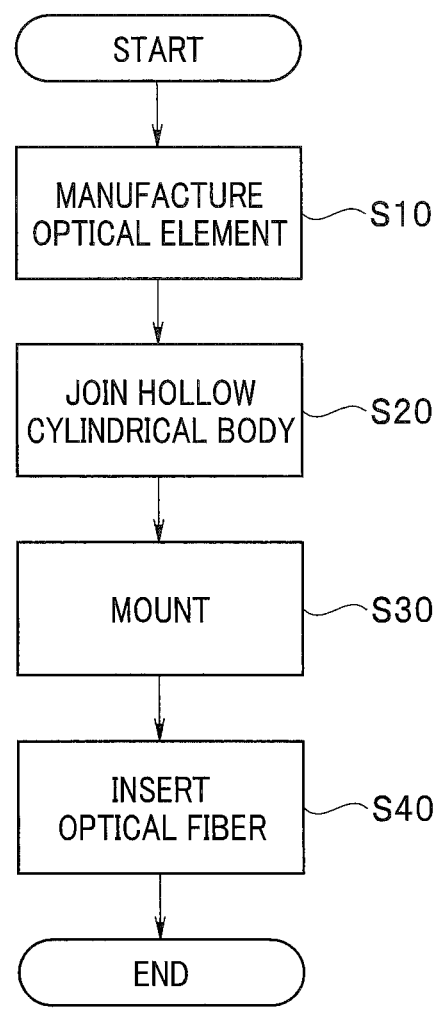
FIG. 3 is a flowchart of a method for manufacturing the optical transmission module according to the first embodiment.

Next, a method for manufacturing the optical transmission module 1 will be described according to a flowchart in FIG. 3.

<Step S10> Optical Element Manufacturing Step

A large number of optical elements 10 are manufactured from one wafer by laminating respective layers on a semiconductor wafer and then separating the laminated layer into many chips. In an optical element manufacturing step, various types of AlGaAs-based semiconductor layers or the like are laminated on a semiconductor wafer made of p-type GaAs, for example.

At this time, the electrode 12 made up of a gold bump or the like and the doughnut-shaped metal film 13 surrounding the light-emitting section 11 are disposed on the light output surface 10SA of each optical element 10 in a wafer condition. Note that a pattern shape of the metal film 13 is not limited to the doughnut shape as long as the hollow cylindrical body 30 can be joined at a predetermined position in an upright condition.

<Step S20> Hollow Cylindrical Body Joining Step

The hollow cylindrical body 30 of a predetermined specification is prepared. The hollow cylindrical body 30 is preferably made of a metal such as nickel or copper that facilitates soldering, a metal having a thermal conductivity of 50 W·m$^{-1}$·K$^{-1}$ or above in particular. The inside diameter D30, the outside diameter and the length of the hollow cylindrical body 30 are determined according to the specification of the optical transmission module 1, but the hollow cylindrical body 30 with high dimensional accuracy is easily available.

One end portion of the hollow cylindrical body 30 is joined to the metal film 13 of the light output surface 10SA of the optical element 10 via the solder 35. The joined hollow cylindrical body 30 remains upright perpendicularly to the light output surface 10SA.

<Step S30> Mounting Step

The wiring board 20 is prepared in which the hole 20H that penetrates the first principal surface 20SA and the second principal surface 20SB is formed. The connection electrode 21 is disposed at a position of the optical element 10 corresponding to the electrode 12 on the first principal surface 20SA of the wiring board 20. Though not shown, the connection electrode 21 is connected to an external connection electrode via wiring. An FPC substrate, a ceramic substrate, a glass epoxy substrate, a glass substrate, a silicon substrate or the like is used as the substrate of the wiring board 20. The wiring board 20 may include, for example, a processing circuit for converting an electric signal to a drive signal for the optical element 10.

The hollow cylindrical body 30 is inserted through the hole 20H of the wiring board 20 and the optical element 10 is flip-chip mounted on the first principal surface 20SA. The Au bump which is the electrode 12 of the optical element 10 is ultrasound joined to the connection electrode 21 of the wiring board 20. Though not shown, an adhesive such as an underfill member or a sidefill member is injected into the joint position. The mounting may be realized by printing solder paste or the like on the wiring board 20, disposing the optical element 10 on the wiring board 20 and then melting the solder by reflow or the like. When the drive signal is applied to the external connection electrode, the light-emitting section 11 of the optical element 10 emits light.

Note that when the hollow cylindrical body 30 is solder-bonded to the optical element 10, the optical element 10 may be mounted on the wiring board 20 via a solder bump (electrode 12) at the same time. That is, the hollow cylindrical body joining step and the mounting step may be performed simultaneously.

<Step S40> Optical Fiber Inserting Step

The distal end portion of the optical fiber 50 is inserted into the hollow cylindrical body 30. For example, the optical fiber 50 having an outside diameter D50 of 80 μm is made up of a core having an outside diameter of 50 μm that transmits light and a clad that covers a perimeter of the core. The optical fiber 50 may be fixed to the hollow cylindrical body 30 using resin or the like after the insertion. Transparent resin may be inserted between the distal end of the optical fiber 50 and the light output surface 10SA of the optical element 10.

As has already been described, the method for manufacturing the optical transmission module 1 facilitates positioning of the light-emitting section 11 of the optical element 10 and the optical fiber 50.

Second Embodiment

An optical transmission module 1A and a method for manufacturing the optical transmission module 1A according to a second embodiment are similar to the optical transmission module 1 or the like, and so only different components or the like will be described.

Figure 4:
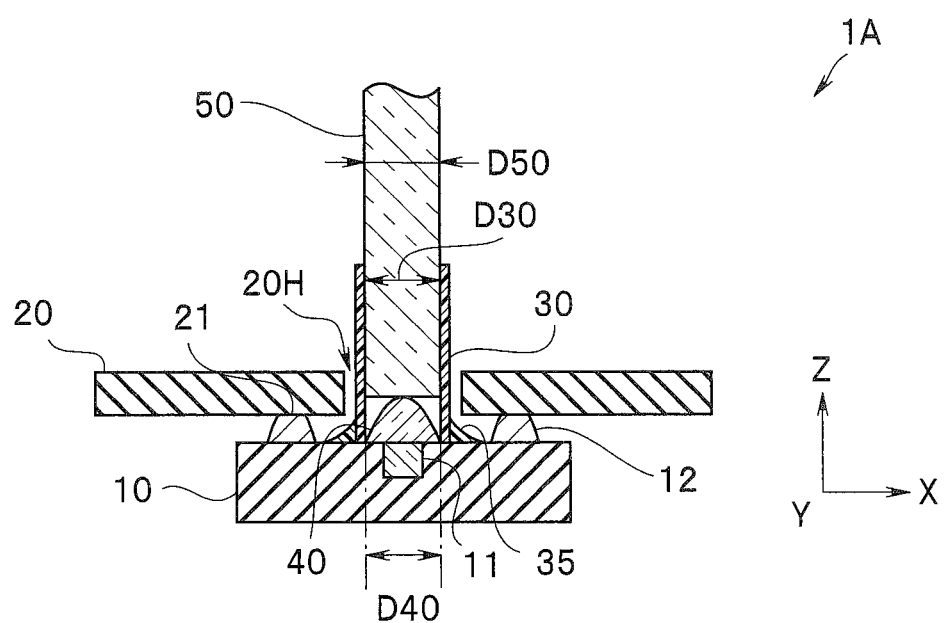
FIG. 4 is a cross-sectional view of an optical transmission module according to a second embodiment.

As shown in FIG. 4, in the optical transmission module 1A, the optical element 10 includes a lens 40 disposed on the light-emitting section 11 and configured to condense light. The convex lens 40 has a circular base and has an outside diameter D40 substantially equal to the inside diameter D30 of the hollow cylindrical body 30 and is accommodated inside the hollow cylindrical body 30.

The lens 40 is made of a transparent material with a high refractive index, for example, glass or resin. The lens 40 is bonded using a transparent adhesive (not shown). Note that in the wafer process for manufacturing an optical element, the lenses 40 may be simultaneously disposed on a plurality of optical elements using a known microlens manufacturing process. The microlens manufacturing process can form a plurality of convex lenses in a desired shape simultaneously by applying transparent resin to a wafer, patterning the resin and then performing predetermined heat treatment.

Even when the center of the light-emitting section 11 of the optical element 10 is misaligned with the center of the lens 40, that is, the center of the optical fiber 50, to a certain degree, light generated by the light-emitting section 11 is condensed at a central part of the lens 40 and guided to the optical fiber 50.

The optical transmission module 1A has the effects of the optical transmission module 1, and since it includes the lens 40, the optical transmission module 1A can guide light generated by the light-emitting section 11 to the optical fiber 50 more easily.

Figure 5:
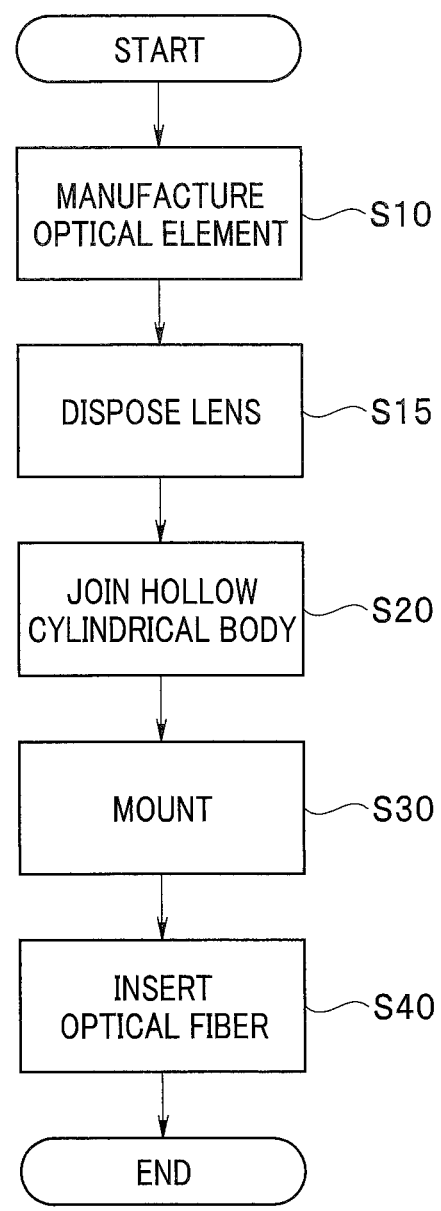
FIG. 5 is a flowchart of a method for manufacturing the optical transmission module according to the second embodiment.
Figure 6A:
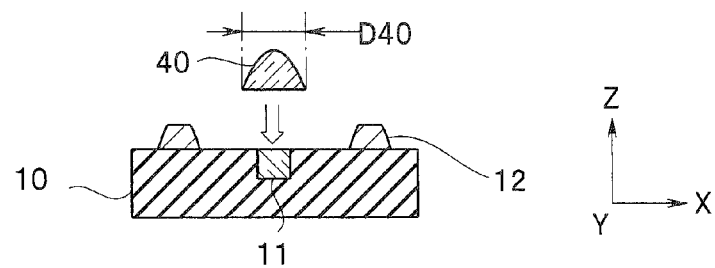
FIG. 6A is a cross-sectional view for illustrating the method for manufacturing the optical transmission module according to the second embodiment.
Figure 6B:
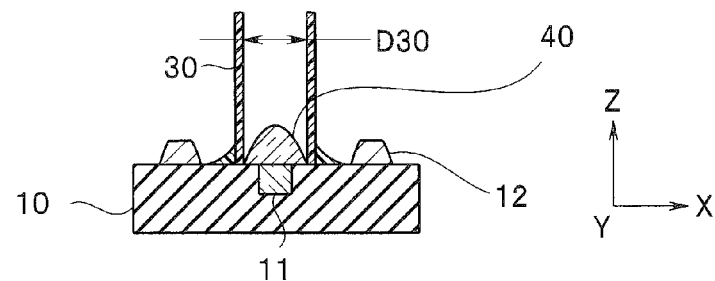
FIG. 6B is a cross-sectional view for illustrating the method for manufacturing the optical transmission module according to the second embodiment.
Figure 6C:
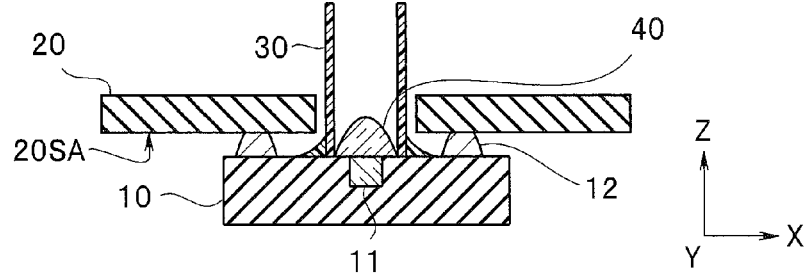
FIG. 6C is a cross-sectional view for illustrating the method for manufacturing the optical transmission module according to the second embodiment.
Figure 6D:
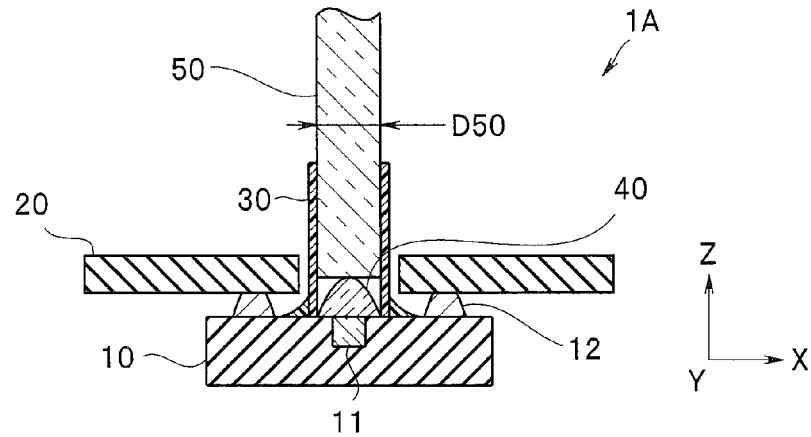
FIG. 6D is a cross-sectional view for illustrating the method for manufacturing the optical transmission module according to the second embodiment.

As shown in a flowchart in FIG. 5, the method for manufacturing the optical transmission module 1A includes a lens disposing step (S15) of disposing the lens 40 that condenses light on the light-emitting section 11 of the optical element 10 before the hollow cylindrical body joining step (step S20) (FIG. 6A). In the hollow cylindrical body joining step, the hollow cylindrical body 30 whose inside diameter D30 is equal to the outside diameter of the lens 40 is joined to the optical element 10 so as to accommodate the lens 40 (FIG. 6B). The mounting step shown in FIG. 6C and the optical fiber inserting step shown in FIG. 6D are the same as those of the method for manufacturing the optical transmission module 1.

As has already been described, the inside diameter D30 of the hollow cylindrical body 30 is substantially the same as the outside diameter D50 of the optical fiber 50. As in the case of the outside diameter D50 of the optical fiber 50, the outside diameter D40 of the lens 40 is preferably (D50+10 μm)≥D40≥D50 and particularly preferably (D50+2 μm)≥D40≥D50.

Note that in the optical transmission module 1A, since the lens 40 has the function as a disposition positioning member of the hollow cylindrical body 30, the doughnut-shaped metal film 13 that surrounds the light-emitting section 11 is not an indispensable component. For example, in the hollow cylindrical body joining step (step S20), the hollow cylindrical body made of resin may be joined to the optical element 10 using a resin adhesive.

The method for manufacturing the optical transmission module 1A has the effects of the method for manufacturing the optical transmission module 1 and further performs positioning of the hollow cylindrical body 30 using the lens 40, and thereby makes manufacturing easier.

Third Embodiment

Since an optical transmission module 1B and a method for manufacturing the optical transmission module 1B according to a third embodiment are similar to the optical transmission modules 1, 1A or the like, only different components or the like will be described.

Figure 7:
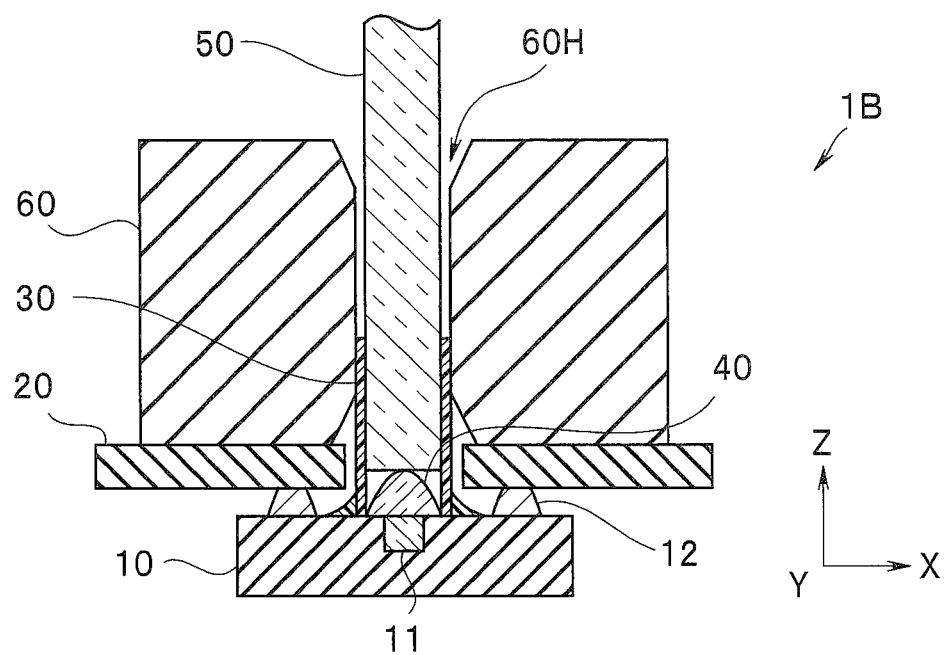
FIG. 7 is a cross-sectional view of an optical transmission module according to a third embodiment.

As shown in FIG. 7, the optical transmission module 1B is provided with a holding member 60. The holding member 60 includes a through hole 60H and the optical fiber 50 inserted into the hollow cylindrical body 30 is inserted through the through hole 60H. The holding member 60 is joined to the second principal surface 20SB of the wiring board 20 via an adhesive layer (not shown).

An inside diameter D60 of the through hole 60H is not particularly limited as long as the hollow cylindrical body 30 can be inserted through the through hole 60H and the through hole 60H may not only be columnar but may also be prismatic. The material of the holding member 60 is ceramics, Si, glass, a metal member such as SUS or the like. Note that the holding member 60 may not be substantially rectangular parallelepiped but may also be substantially columnar or substantially conical.

Figure 8:
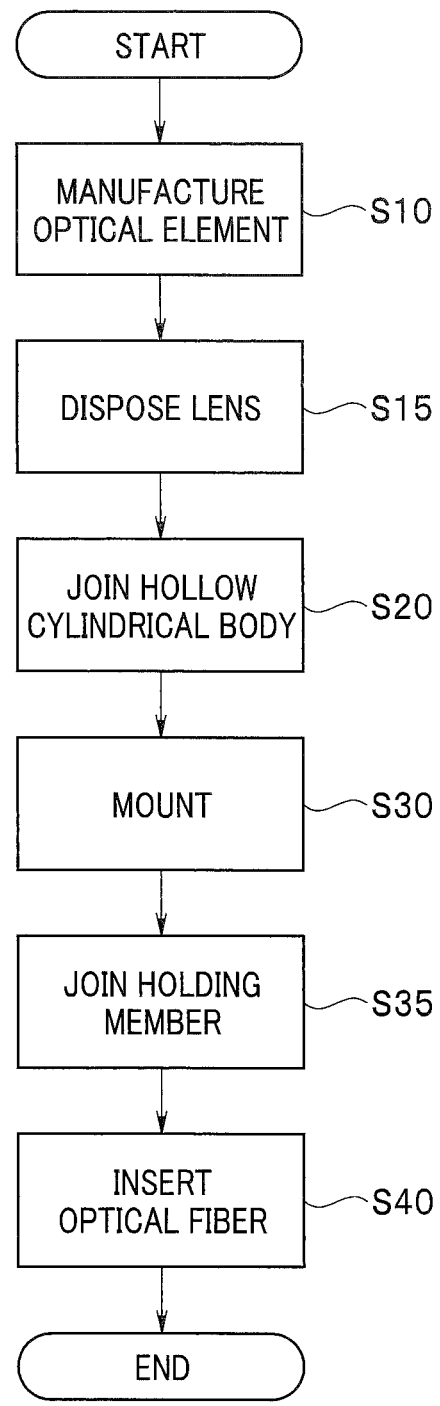
FIG. 8 is a flowchart of a method for manufacturing the optical transmission module according to the third embodiment.

As shown in a flowchart in FIG. 8, the method for manufacturing the optical transmission module 1B includes a holding member joining step of inserting the hollow cylindrical body 30 into the through hole 60H of the holding member 60 having the through hole 60H and joining the holding member 60 to the second principal surface 20SB of the wiring board 20.

The optical transmission module 1B or the like has the effects of the optical transmission module 1 or the like, and further exhibits high joining reliability of the optical fiber 50.

Note that the optical transmission modules 1 and 1A of the embodiments are small and have small diameters in particular. For this reason, the optical transmission modules 1 and 1A can be preferably used at the distal end portion of an endoscope in particular. Such an endoscope including the optical transmission module 1 or 1A has a distal end portion which has a small diameter and is minimally invasive.

The present invention is not limited to the embodiments described above, and various modifications, alterations and

What is claimed is:

1. An optical transmission module comprising:
   an optical element comprising a light-emitting section configured to output light of an optical signal;
   a hollow cylindrical body having an end fixed to a light output surface of the optical element;
   a wiring board electrically connected to the optical element, the wiring board being configured to have a hole that penetrates a first principal surface and a second principal surface, in which the optical element is mounted on the first principal surface and the hollow cylindrical body is inserted through the hole; and
   an optical fiber configured to transmit the optical signal, a distal end portion of which is inserted into the hollow cylindrical body from an opening of the hollow cylindrical body on a side of the second principle surface.

2. The optical transmission module according to claim 1, wherein the optical element comprises a lens disposed on the light-emitting section and configured to condense the light, and
   the lens has an outside diameter equal to the inside diameter of the hollow cylindrical body and is accommodated inside the hollow cylindrical body.

3. The optical transmission module according to claim 1, wherein the hollow cylindrical body is made of metal and the end is solder-bonded to a metal film disposed around the light-emitting section.

4. The optical transmission module according to claim 1, further comprising a through hole through which the optical fiber inserted into the hollow cylindrical body is inserted; and
   a holding member joined to the second principal surface of the wiring board.

5. A method for manufacturing an optical transmission module, the method comprising:
   a hollow cylindrical body joining step of fixing an end of a hollow cylindrical body to a light output surface which outputs light of an optical signal of an optical element;
   a mounting step of inserting the hollow cylindrical body through a hole of a wiring board, the hole penetrating a first principal surface and a second principal surface, and mounting the optical element on the first principal surface to electrically connect the wiring board to the optical element; and
   an optical fiber inserting step of inserting a distal end portion of an optical fiber configured to transmit the optical signal into the hollow cylindrical body from an opening of the hollow cylindrical body on a side of the second principle surface, an outside diameter of the optical fiber being equal to an inside diameter of the hollow cylindrical body.

6. The method for manufacturing an optical transmission module according to claim 5, further comprising, before the hollow cylindrical body joining step, a lens disposing step of disposing a lens configured to condense the light on the light-emitting section of the optical element, an outside diameter of the lens being equal to the inside diameter of the hollow cylindrical body,
   wherein in the hollow cylindrical body joining step, the hollow cylindrical body is joined so as to accommodate the lens.

7. The method for manufacturing an optical transmission module according to claim 5, wherein in the hollow cylindrical body joining step, the hollow cylindrical body is made of metal and the end is solder-bonded to a metal film disposed around the light-emitting section.

8. The method for manufacturing an optical transmission module according to claim 5, further comprising a holding member joining step of inserting the hollow cylindrical body into a through hole formed in a holding member and joining the holding member to the second principal surface of the wiring board.

9. The optical transmission module according to claim 1, wherein the inside diameter of the hollow cylindrical body is no more than 2 µm larger than the outside diameter of the optical fiber at the distal end portion of the optical fiber which is inserted into the hollow cylindrical body.

10. The method according to claim 5, wherein the inside diameter of the hollow cylindrical body is set to be no more than 2 µm larger than the outside diameter of the optical fiber at the distal end portion of the optical fiber which is inserted into the hollow cylindrical body.

* * * * *